SEMICONDUCTOR MANUFACTURING METHOD

Filed Feb. 3, 1964

INVENTORS
KUNIHARU NEMOTO
YUICHIRO DAIHISA
BY
Hopgood & Calimafde
ATTORNEYS

United States Patent Office 3,282,742
Patented Nov. 1, 1966

3,282,742

SEMICONDUCTOR MANUFACTURING METHOD

Kuniharu Nemoto and Yuichiro Daihisa, Minatoku, Tokyo, Japan, assignors to Nippon Electric Company Limited, Minatoku, Tokyo, Japan Filed Feb. 3, 1964, Ser. No. 341,882
Claims priority, application Japan, Feb. 8, 1963, 38/6,560
2 Claims. (Cl. 148—1.5)

This invention relates to an improved method of manufacturing semiconductors, and is particularly useful in the manufacture of tunnel diodes and backward diodes.

As those knowledgeable in the art are aware, a tunnel diode is made with a step junction consisting of degenerated p-type and n-type regions having an extremely high carrier density. The p-n junction that is formed by prior art techniques has an extremely narrow width, and so it is possible to move the carrier through the p-n junction by the tunnel effect of quantum mechanics. However, the extremely narrow width of the p-n junction results in low mechanical strength and an increase in the series resistance of the semiconductor crystal. As a further disadvantage of the extremely narrow junction, difficulty in setting the peak current of the diode is experienced. As a consequence, the manufacture of high quality tunnel diodes is an extremely difficult and expensive process.

Accordingly, it is an object of this invention to provide an improved diode manufacturing method.

It is another object to reduce the difficulty and manufacturing cost of such diodes.

Another object is to enable the manufacture of diodes of the type described whereby the peak current can be more easily and accurately controlled.

A still further object is to produce, more easily and less expensively, tunnel diodes having extremely stable characteristics.

Figure 1:
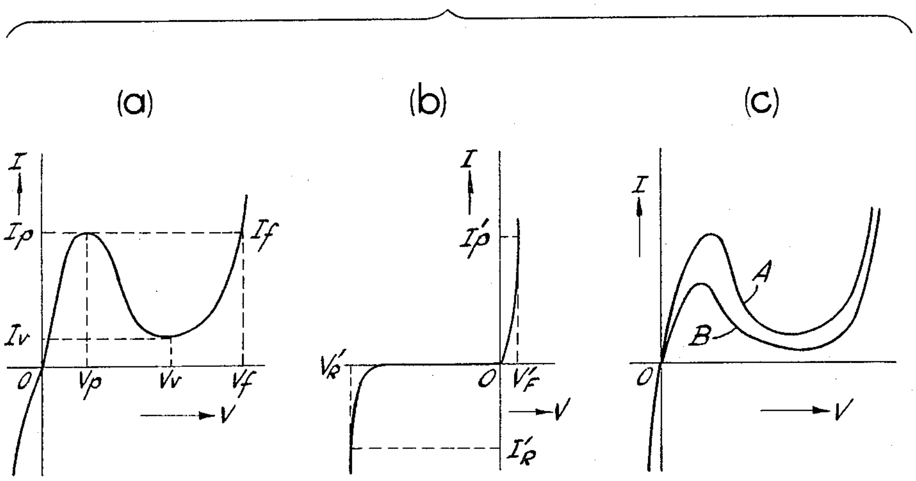
Figure 2:
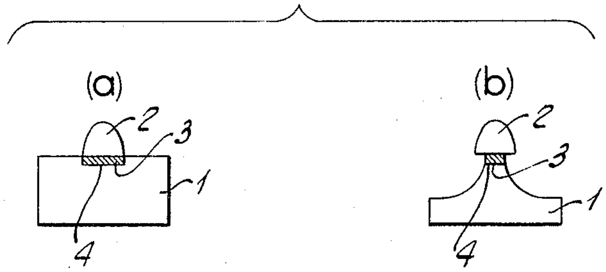
Figure 3:
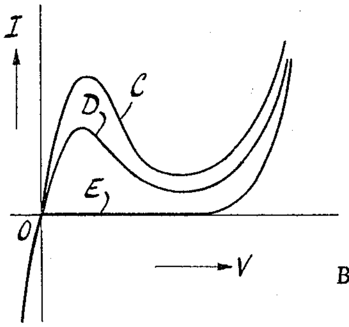

All of the objects, features and advantages of this invention and the manner of attaining them will become more apparent and the invention itself will be best understood by reference to the following description of an embodiment of the invention taken in conjunction with the accompanying drawing, in which FIGS. 1*a* and 1*c* are current-voltage characteristic curves of tunnel diodes and FIG. 1*b* is the current-voltage characteristic curve of a backward diode, FIGS. 2*a* and 2*b* are vertical sections of tunnel diode structures, and FIG. 3 shows current-voltage characteristic curves of a tunnel diode and a backward diode manufactured by the method of this invention.

Briefly, the invention teaches a method for accurately controlling the peak current value of a diode by utilizing the phenomenon that the tunnel effect can be reduced by the application of a relatively large current to a narrow p-n junction.

Referring now to FIG. 1*a*, the current (I) and voltage (V) characteristics are such that the diode has negative resistance characteristics in the forward direction and thus the diode exhibits the Esaki effect due to the energy band structure. The value $I_p$ represents the peak value of current, $V_p$ is the voltage value corresponding to the peak current $I_p$, $I_v$ is the lowest value of current, $V_v$ is the voltage value corresponding to the current $I_v$, $I_f$ is the value of forward current equivalent to the aforementioned peak value $I_p$ when the voltage value is $V_f$, and the negative resistance region is between $V_v$ and $V_p$ on the scale.

As a circuit element, the tunnel diode is useful for oscillation, amplification and high frequency switching functions. Basically, it is important that the product of the negative resistance value and the junction capacitance value be as small as possible. At the same time, however, it is often required that the characteristics of current and voltage, and especially the peak current value $I_p$ in FIG. 1*a*, be made a fixed value.

In FIG. 1*b*, the characteristic of a backward diode is shown, from which it will be seen that the peak current value $I_p$ is made extremely low and that the peak value $I_p$ and the lowest value $I_v$ of current are made nearly equal. As the term "backward diode" implies, the resistance in the reverse direction is lower than that in the forward direction, and thus the rectification is opposite in direction to that of the ordinary diode.

Accordingly, in FIG. 1*b*, the direction of low resistance (i.e. the forward direction) corresponds to the reverse direction characteristics of a tunnel diode, and the direction of high resistance (i.e. the reverse direction) corresponds to the forward direction characteristics where the peak current value $I_p$ of the tunnel diode is extremely small. Hence, the forward direction voltage is given here as $V'_F$, the reverse direction voltage as $V'_R$ and the reverse current value is $I'_R$.

A tunnel diode is customarily manufactured in the following manner. A heavily doped semiconductor crystal 1 of given conductivity type, as shown in FIG. 2*a*, is alloyed with a suitable metal 2 having opposite conductivity type impurities. Between the opposite conductivity type heavily doped regions 3 and 1 there will be formed a narrow p-n junction 4, which will develop the so-called "Esaki effect." In this case, since the junction area generally is not very small, the peak current value and the junction capacitance value will be comparatively large, as will be appreciated from the curve A in FIG. 1*c*.

Referring now to FIG. 2*b*, the semiconductor region around the junction is generally eliminated by means of electrolytic polishing in order to reduce the area of the junction, and to reduce the values of peak current and junction capacitance, as will be appreciated from the curve B in FIG. 1*c*. Such electrolytic polishing and other control methods are currently utilized by those skilled in the prior art to make the peak current value uniform.

Such conventional control methods, however, have the following important disadvantages. As shown in FIG. 2*b*, the semiconductor area around the tunnel diode junction becomes so slender that the series resistance of the semiconductor crystal will be substantially increased and the mechanical strength of the junction will be substantially decreased. These results are, of course, undesirable in a tunnel diode. As an additional disadvantage, it will be difficult to set the peak current at a fixed value because the smaller the area of the junction, the faster the peak current decreases. As a consequence, the manufacture of high quality tunnel diodes having a small junction is an extremely difficult and expensive process.

This invention involves a method for accurately controlling the peak current value $I_p$ by utilizing the phenomenon that the tunnel effect will decrease when a very large current is applied to a narrow p-n junction where the Esaki effect can be observed in a forward or reverse direction. The precise cause of this phenomenon is not yet fully understood. Since no considerable rise in junction temperature is experienced during this phenomenon, it is not possible to increase the junction width due to diffusion of impurities that may be brought about by a temperature rise.

In view of the fact that an extremely narrow p-n junction has a large tunnel effect, the following factors are significant: (a) Uneven distribution of impurities within the junction may cause non-uniformity of width of the narrow junction, resulting in wide variations in the tunnel effect. (b) Because of uneven distribution of tunnel effect of the junction, current distribution also may become uneven. The greater the tunnel effect, the greater the current density. (c) Due to partial heating and electric field effect, the tunnel effect may be reduced, particularly in the narrower portion of the junction. (d) Distribution of impurities may thus become even.

Referring now to FIG. 3, the curve C shows the voltage-current characteristic of a tunnel diode before treatment according to the invention. When a large forward current which has a peak value several times that ultimately desired is made to flow in the junction area of the tunnel diode, while closely observing reduction of the current-voltage characteristic on an oscilloscope, then the peak current can easily be brought to a fixed value by adjusting the forward current, as shown by the curve D of FIG. 3. This will not substantially change the junction capacitance.

Accordingly, the product of negative resistance and junction capacitance of the tunnel diode will be increased by the above process compared with that existing before the current treatment is applied. However, if the product of negative resistance and junction capacitance is a relatively small value initially, then there will be no difficulty in practical use.

A backward diode can be made in the following manner. A large forward current which has a peak value several times greater than the desired value is caused to flow in the junction area of a tunnel diode, while monitoring the current-voltage characteristic on an oscilloscope. By adjusting the forward current to reduce the peak current to a small value, as shown by the curve E in FIG. 3, thereby eliminating the negative resistance area, the tunnel diode can be converted to a backward diode.

The utilization of the method of this invention has a number of distinct advantages. When making composite elements for a tunnel diode, it is very difficult to manufacture such elements to a uniform value of peak current. By this method, however, the peak current of the element can be easily and accurately controlled. Another important advantage is that the method has a junction stabilizing effect. A still further advantage of the process is that it allows investigation of the current characteristic so that the peak current value of an element which will not undergo a change can be determined. Accordingly the limit of current where a given diode can perform in a stabilized manner can be accurately determined.

An explanation will now be given of a practical embodiment of the above treatment applied to the manufacture of a germanium tunnel diode having a peak current value of 2 milliamperes. As the semiconductor crystal, a p-type germanium single crystal having a resistivity of 0.0005 ohm-cm. to which gallium has been added, will be used. This p-type germanium single crystal is alloyed with an indium ball of 0.01 cm. diameter, having 3% arsenic. An electrode is then connected to the base crystal and also to the alloyed portion formed by the indium ball.

Next, by electrolytic polishing similar to the conventional method, the junction area is reduced and the peak current fixed at a value of approximately 20 ma. At this time, the junction capacitance may be of the order of 0.5–1 mmf. and the series resistance of the order of 2–3 ohms. It is not necessary to reduce the junction area in order to control the peak current value $I_p$ in accordance with the method of the invention; however, it is necessary to properly select the junction capacitance and to fix the current to an appropriate value.

It should be observed that the treatment described above in accordance with the invention may utilize either a forward current or a reverse current. However, in order to set the peak current $I_p$ to the desired fixed value, it is more convenient to use a forward current in the treatment circuit. More specifically, when the diode element is connected to the ammeter for measuring forward current and also to the viewing apparatus for observing the Esaki characteristics, and when a forward current as high as two to ten times the peak current value is driven through the element, a visible decrease in the value of peak current can be observed.

The larger the forward current, the faster the peak current decreases. At a value near the required value of peak current, the forward current must be decreased gradually. When the peak current $I_p$ becomes precisely to the value of 2 milliamperes as observed by the viewing apparatus, the forward current must then be reduced to approximately the value of $I_F$ of the Esaki characteristic.

By means of this treatment, all the peak current values will come exactly within the range of 2 milliamperes ±2%. Attainment of even greater precision of the order of 2 milliamperes ±1% can be achieved if the precision of the direct viewing apparatus is improved. The junction capacitance and series resistance after treatment will be virtually unchanged from their pre-treatment values. Thus, for the example given, the values of junction capacitance and series resistance will be, respectively, approximately 0.5–1 mmf. and 2–3 ohms.

The Esaki diodes manufactured by the method of this invention are so stable that there will be virtually no change in the characteristics during normal operation.

The above description covers a practical application of the invention for p-type germanium. However, it will be apparent that this method can also be applied to backward diodes and tunnel diodes which employ silicon and intermetallic compounds, and also when manufacturing composite semiconductor devices having built-in diodes.

While the foregoing description sets forth the principles of the invention in connection with the specific apparatus, it is to be understood that the description is made only by way of example and not as a limitation of the scope of the invention as set forth in the objects thereof and in the accompanying claims.

What is claimed is:

1. A method for making a semiconductor device characterized by the tunnel effect of quantum mechanics and having a narrow p-n junction wherein transition of impurity concentration from a degenerate p-type region to a degenerate n-type region is abrupt, said method comprising shifting the peak current characteristic of said device from a first value to a second predetermined value by developing a current through said narrow p-n junction in the forward or backward direction while monitoring the current-voltage characteristic thereof, said current having a value greater than twice the peak current of the current-voltage characteristic of said device, and maintaining said current for a time sufficient to produce said predetermined value.

2. A method for treating a semiconductor device having a narrow p-n junction therein, said method comprising passing through said junction a driving current having a substantially greater value than the peak current of said device to reduce the peak current characteristic to a predetermined lower value, simultaneously monitoring the current-voltage characteristic of said device, and maintaining said driving current for a time sufficient to achieve said predetermined lower value as observed by monitoring said current-voltage characteristic.

References Cited by the Examiner

UNITED STATES PATENTS

| | | | |
|---|---|---|---|
| 2,926,418 | 3/1960 | Zuleeg | 148—1.5 |
| 3,163,568 | 12/1964 | Mieux | 148—1.5 |
| 3,181,983 | 5/1965 | Lape | 148—1.5 |

HYLAND BIZOT, *Primary Examiner.*